(12) United States Patent
Lee et al.

(10) Patent No.: US 6,620,668 B2
(45) Date of Patent: Sep. 16, 2003

(54) METHOD OF FABRICATING MOS TRANSISTOR HAVING SHALLOW SOURCE/ DRAIN JUNCTION REGIONS

(75) Inventors: Seong-jae Lee, Daejon (KR); Won-ju Cho, Daejon (KR); Kyoung-wan Park, Daejon (KR)

(73) Assignee: Electronics and Telecommunications Research Institute, Daeion (KR)

( * ) Notice: Subject to any disclaimer, the term of this patent is extended or adjusted under 35 U.S.C. 154(b) by 0 days.

(21) Appl. No.: 10/117,001

(22) Filed: Apr. 5, 2002

(65) Prior Publication Data

US 2003/0096484 A1 May 22, 2003

(30) Foreign Application Priority Data

Nov. 22, 2001 (KR) ..................... 2001-0073006

(51) Int. Cl.[7] ................ H01L 21/8238; H01L 21/336
(52) U.S. Cl. ................. 438/199; 438/301; 438/229
(58) Field of Search ................. 438/301, 199, 438/229, 588, 563, 564

(56) References Cited

U.S. PATENT DOCUMENTS

| | | | |
|---|---|---|---|
| 4,965,220 A | * 10/1990 | Iwasaki | 438/358 |
| 5,340,770 A | 8/1994 | Allman et al. | 437/164 |
| 5,407,847 A | 4/1995 | Hayden et al. | 437/44 |
| 5,478,776 A | 12/1995 | Luftman et al. | 437/163 |
| 5,773,355 A | * 6/1998 | Inoue et al. | 438/459 |
| 5,897,364 A | 4/1999 | Pan | 438/563 |
| 5,981,321 A | * 11/1999 | Chao | 438/199 |
| 5,989,960 A | * 11/1999 | Fukase | 438/596 |
| 6,008,098 A | 12/1999 | Pramanick et al. | 438/305 |
| 6,097,059 A | * 8/2000 | Yamada | 257/321 |
| 6,218,270 B1 | 4/2001 | Yasunaga | 438/530 |
| 6,265,255 B1 | * 7/2001 | Hsien | 438/199 |
| 6,355,554 B1 | * 3/2002 | Choi et al. | 438/632 |
| 6,372,588 B2 | * 4/2002 | Wristers et al. | 438/564 |

OTHER PUBLICATIONS

IEEE Transactions on Electron Devices, vol. 40, No. 12, Dec. 1993, pp. 2264–2272.

* cited by examiner

Primary Examiner—John F. Niebling
Assistant Examiner—Walter L. Lindsay, Jr.
(74) Attorney, Agent, or Firm—Blakely, Sokoloff, Taylor & Zafman

(57) ABSTRACT

A method of fabricating a MOS transistor having shallow source/drain junction regions is provided. A diffusion source layer is formed on a semiconductor substrate on which gate patterns are formed. Same type or different type of impurities are implanted into the diffusion source layer several times in different directions. As a result, dislocation does not occur and the impurity concentration of the diffusion source layer can be nonuniformly controlled so that damage to the crystal structure of the semiconductor substrate does not occur. Also, the impurities nonuniformly contained in the diffusion source layer are diffused into the semiconductor substrate by a solid phase diffusion method to form shallow source/drain junction regions having LDD regions and highly doped source/drain regions by a self-alignment method.

28 Claims, 9 Drawing Sheets

METHOD OF FABRICATING MOS TRANSISTOR HAVING SHALLOW SOURCE/DRAIN JUNCTION REGIONS

BACKGROUND OF THE INVENTION

1. Field of the Invention

The present invention relates to a method of fabricating a MOS transistor, and more particularly, to a method of a MOS transistor having shallow source/drain junction regions.

2. Description of the Related Art

In general, gate patterns composed of gate oxide layers and gate electrodes are formed on a semiconductor substrate. Source/drain junction regions are formed in the semiconductor substrate underneath both sidewalls of the gate patterns. As a result, MOS transistors are formed.

The source/drain junction regions must be shallow junction regions as the MOS transistors are highly integrated. The shallow junction regions must be junction regions, which are formed to a shallow depth into a substrate, have a high concentration and high activation rate of impurities to reduce resistance, and has an abrupt junction profile in horizontal and vertical directions.

Conventional source/drain junction regions are formed by an ion implantation method or a solid phase diffusion method. In the ion implantation method, an ion implanter highly accelerates impurities with a high acceleration voltage and then implants the impurities into a substrate to form source/drain junction regions. In the solid phase diffusion method, a solid phase diffused source is formed on a substrate, and then a dopant in the solid phase diffusion source is diffused and doped into the substrate to form shallow junction regions.

In order to avoid the confusion of the terminology used in this detailed description of the present invention, impurities implanted by the ion implantation method are described as "impurities", and impurities implanted by the solid phase diffusion method are described as "dopant". Also, implanting ionic impurities is referred to as "ion implantation", and diffusing impurities of a substrate already containing impurities by the solid phase diffusion method is referred to as "doping".

The ion implantation method damages the crystal structure of the substrate because of the kinetic energy of impurity ions, and thus dislocation occurs. The dislocation causes a sharp diffusion of the implanted impurities as well as leakage in source/drain junction regions. Thus, it becomes impossible to form shallow source/drain junction regions. The solid phase diffusion method has difficulty increasing the doping concentration of dopant in the solid phase diffusion source sufficient for shallow source/drain junction regions having a low resistance. Also, there is a problem of precisely controlling the doping concentration of the dopant in the solid phase diffusion source.

SUMMARY OF THE INVENTION

To solve the above-described problems, it is an object of the present invention to provide a method of fabricating a MOS transistor having shallow source/drain junction regions in which dislocation does not occur and the doping concentration of impurities is precisely controlled.

Accordingly, to achieve the above object, according to an embodiment of the present invention, there is provided a method of fabricating a MOS transistor. In the method, gate patterns are formed on a semiconductor substrate and a diffusion source layer is on the entire surface of the semiconductor substrate. The diffusion source layer may be an USG layer or a silicon oxide layer. The USG layer may be formed by spin-coating and densifying a liquid silicate glass. The silicon oxide layer may be formed by CVD or PECVD using a compound gas containing $SiH_4$ and $O_2$, dry oxidation, or wet oxidation. The whole of the diffusion source layer or a portion of the diffusion source layer may be etched to be thin.

The same type or different type of impurities are implanted into the diffusion source layer several times in different directions so that the impurity concentration of portions of the diffusion source layer on upper surfaces of the gate patterns and the semiconductor substrate is higher than the impurity concentration of portions of the diffusion source layer on sidewalls of the gate patterns due to a shadow effect. The implantation of the impurities into the diffusion source layer may be performed using a general ion implanter or a plasma ion implanter including a Pill and an ISI. The impurities may be implanted into the diffusion source layer at an angle from the semiconductor substrate to adjust the impurity concentration of the portions of the diffusion source layer on the sidewalls of the gate patterns to $10^{17}$–$10^{22}$ cm$^{-3}$. The impurities may be implanted vertically into the diffusion source layer to adjust the impurity concentration of the portions of the diffusion source layer on the upper surfaces of the gate patterns and the semiconductor substrate to $10^{18}$–$10^{22}$ cm$^{-3}$.

Impurities contained in the diffusion source layer are diffused into the semiconductor substrate by a solid phase diffusion method to form shallow source/drain junction regions having LDD regions underneath the sidewalls of the gate patterns and highly doped source/drain regions by a self-alignment method. Forming the shallow source/drain junction regions by the solid phase diffusion method may be performed using RTA, spike annealing, or laser annealing. It is preferable that in the RTA, the semiconductor substrate on which the diffusion source layer containing the impurities is formed is annealed at a temperature of 950–1150° C. for 1–1000 seconds in an inert gas atmosphere. It is preferable that in the spike annealing, the semiconductor substrate on which the diffusion source layer containing the impurities is formed is annealed at a temperature of 950–1200° C. in an inert gas atmosphere. Preferably, the shallow source/drain junction regions have a doping depth of 50 nm or less on the semiconductor substrate and a doping concentration $10^{18}$–$10^{22}$ cm$^{-3}$.

According to another embodiment of the present invention, there is provided a method of fabricating a MOS transistor. In the method, gate patterns are formed on a semiconductor substrate in which a P-well and an N-well are formed. A diffusion source layer is formed on the entire surface of the semiconductor substrate. A photoresist pattern is formed on the diffusion source layer to open the N-well or the P-well. The same type or different type of impurities are implanted first into a portion of the diffusion source layer over the N-well and then into a portion of the diffusion source layer over the P-well, or first into the portion of diffusion source layer over the P-well and then into the portion of the diffusion source layer over the N-well, several times in different directions so that the impurity concentration of portions of the diffusion source layer on upper surfaces of the gate patterns and the semiconductor substrate is higher than the impurity concentration of portions of the diffusion source layer at sidewalls of the gate patterns due to a shadow effect. The photoresist pattern is removed. Impurities contained in the portions of the diffusion source layer over the N-well and the P-well are diffused into the semiconductor substrate by a solid phase diffusion method to form shallow source/drain junction regions having LDD regions underneath the sidewalls of the gate patterns and highly doped source/drain regions by a self-alignment method.

As described above, according to the present invention, the same type or different type of impurities are implanted into the diffusion source layer several times in different directions. As a result, dislocation does not occur and the impurity concentration of the diffusion source layer can be nonuniformly controlled. Also, the impurities nonuniformly contained in the diffusion source layer are diffused into the semiconductor substrate by a solid phase diffusion method to form shallow source/drain junction regions having LDD/SDE regions and highly doped source/drain regions by a self-alignment method.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
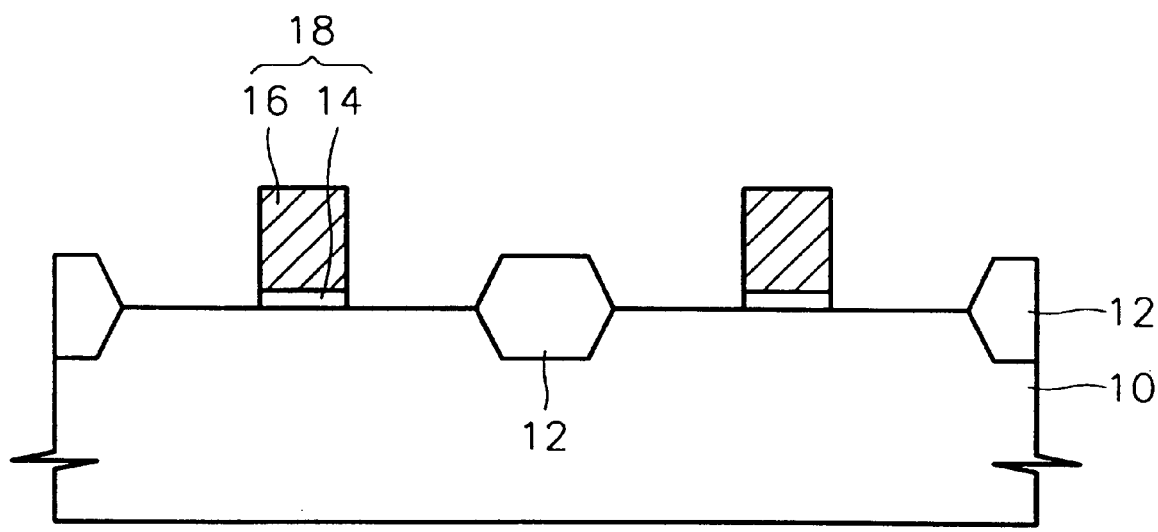
FIGS. 1 through 6 are cross-sections explaining a method of fabricating a MOS transistor having shallow source/drain junction regions according to a first embodiment of the present invention.

Hereinafter, embodiments of the present invention will be described in detail with reference to the attached drawings. However, the embodiments of the present invention may be modified into various other forms, and the scope of the present invention must not be interpreted as being restricted to the embodiments. Rather, the embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer may be formed directly on the other layer or the substrate, or other layers may intervene therebetween.

FIGS. 1 through 6 are cross-sections explaining a method of fabricating a MOS transistor having shallow source/drain junction regions according to a first embodiment of the present invention. Referring to FIG. 1, field oxide layers 12 are formed on a semiconductor substrate 10, e.g., a p-type or n-type silicon substrate to define active regions and inactive regions. Gate patterns 18 composed of gate oxide layers 14 and gate electrodes 16 are formed on the semiconductor substrate 10 in the active regions. To form the gate patterns 18, the surface of the semiconductor substrate 10 is oxidized to form a silicon oxide layer, a polysilicon layer having a thickness of 100–300 nm is deposited on the silicon oxide layer by low pressure chemical vapor deposition (LPCVD), and the polysilicon layer and the silicon oxide layer are patterned by photolithography.

Figure 2:
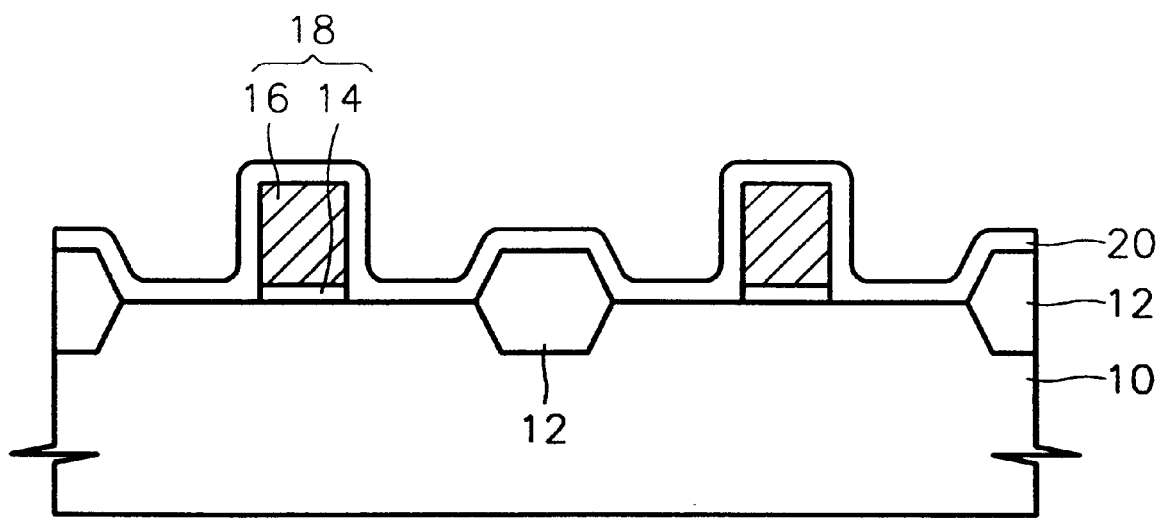

Referring to FIG. 2, a diffusion source layer 20 is formed on the entire surface of the semiconductor substrate 10. The diffusion source layer 20 is formed to a thickness of 20–400 nm. The diffusion source layer 20 serves as a buffer layer for preventing the semiconductor substrate 10 from being damaged during the implantation of impurity ions.

The diffusion source layer 20 is an undoped silicate glass (USG) layer or a silicon oxide layer. To form the USG layer, a liquid silicate glass is spin-coated and then densified at a temperature of 200–600° C. for 2–30 minutes. The silicon oxide layer is formed by CVD or plasma enhanced chemical vapor deposition (PECVD) using a compound gas containing $SiH_4$, and $O_2$, or dry oxidation or wet oxidation. The whole of the diffusion source layer 20 or a portion of the diffusion source layer 20 may be etched to be thin.

Figure 3:
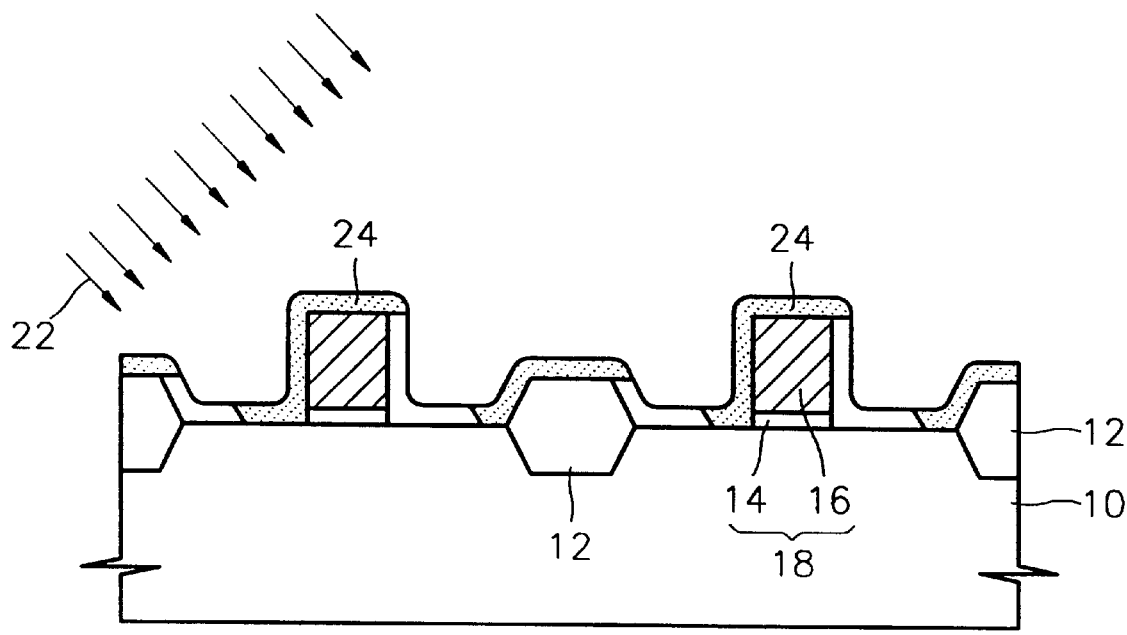
Figure 4:
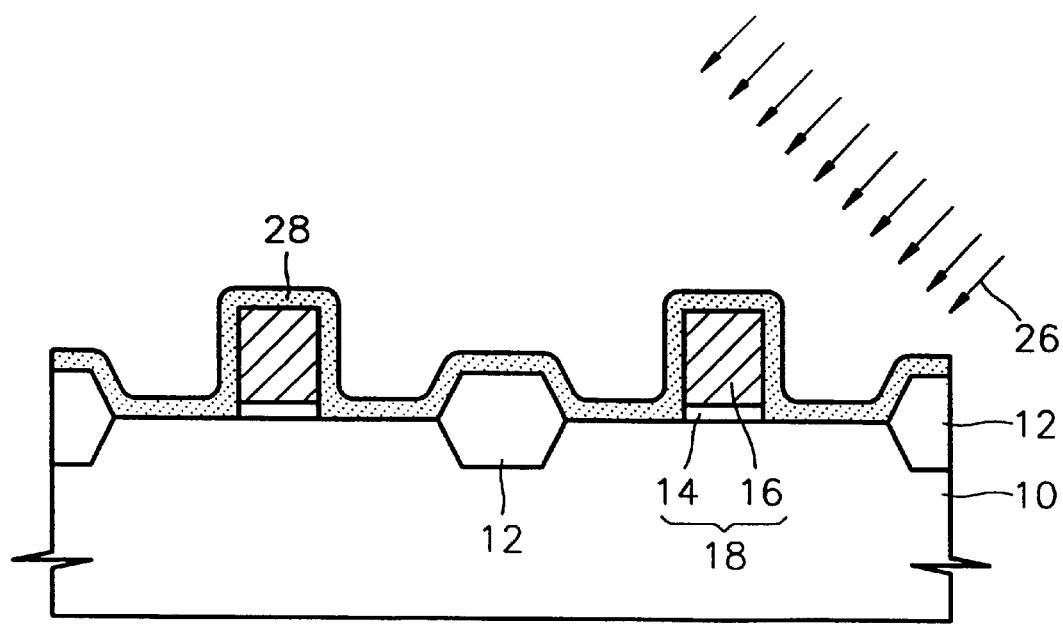

Referring to FIGS. 3 and 4, impurities 22 and 26 are implanted into the diffusion source layer 20 at an angle. In other words, as shown with reference numeral 24 in FIG. 3, the impurities 22 are radiated at an angle from the left side of the semiconductor substrate 10 to be implanted into portions of the diffusion source layer 20 on the left sidewalls and upper surfaces of the gate patterns 18, the surfaces of the field oxide layers 12, and the surface of the semiconductor substrate 10. In FIG. 4, the impurities 26 are radiated at an angle from the right side of the semiconductor substrate 10 to be implanted into portions of the diffusion source layer 20 on the right sidewalls and upper surfaces of the gate patterns 18, the surfaces of the field oxide layers 12, and the surface of the semiconductor substrate 10.

As a result, a diffusion source layer 28, into which impurities are uniformly implanted, is formed. In particular, the impurity concentration of portions of the diffusion source layer 28 formed by implanting impurities into both sidewalls of the gate patterns 18 is adjusted to $10^{17}$–$10^{22}$ cm$^{-3}$.

The impurities 22 and 26, which are implanted into the diffusion source layer 20, have a conductivity type opposite to the conductivity type of the semiconductor substrate 10. For example, if the semiconductor substrate 10 is a p-type silicon substrate, the impurities 22 and 26 are n-type impurities, e.g., P, As, or Sb. If the semiconductor substrate 10 is an n-type silicon substrate, the impurities 22 and 26 are p-type impurities, e.g., B or In.

Instead of P or B, a heavy impurity element such as As (or Sb) or In is selected as the impurities 22 and 26 in consideration of a subsequent process for forming lightly doped drain (LDD) regions or source/drain extension regions (SDE). Thus, the diffusion depth may be reduced in a subsequent heat treatment process.

The impurities 22 and 26 are implanted into the diffusion source layer 20 at an angle using a general ion implanter or a plasma ion implanter including a Plasma Immersion Ion Implanter (PIII) and an Ion Shower Implanter (ISI).

The plasma ion implanter uses low acceleration voltages in which impurity ions are implanted in a predetermined direction. The PIII operates by generating plasma over a wafer, i.e., a semiconductor substrate, periodically applying negative voltages to the wafer, and accelerating plasma ions to bombard the wafer with the plasma ions. The ISI operates by extracting/accelerating plasma ions away from the wafer to a large area electrode to bombard the wafer with the plasma ions.

When the impurities 22 and 26 are implanted into the diffusion source layer 20 at an angle, an acceleration voltage of the impurities 22 and 26 is controlled so that the position of maximum impurity concentration is within the diffusion source layer 20. As a result, damage to the crystal structure of the semiconductor substrate is reduced.

In particular, in the plasma ion implanter, the impurity ions 22 and 26 radiated at low acceleration voltages may be implanted into the diffusion source layer 20 to a high concentration of over $10^{13}$–$10^{15}$ cm$^{-3}$ without damaging to the crystal structure of the semiconductor substrate 10.

Figure 5:
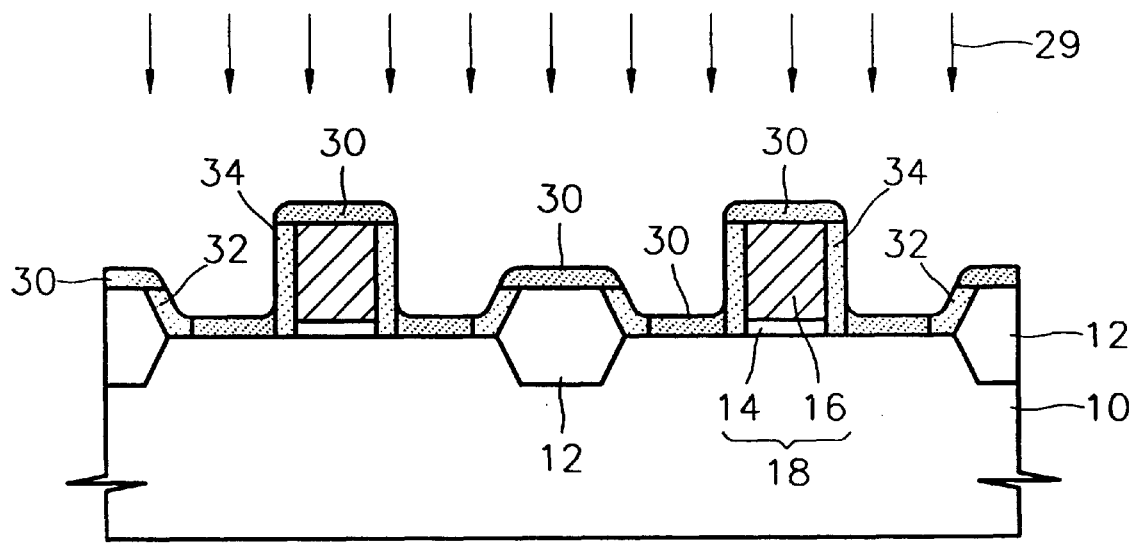

Referring to FIG. 5, impurities 29 are additionally implanted into the diffusion source layer 28, into which the impurities 22 and 26 are already implanted, in a vertical direction, i.e., perpendicular to the semiconductor substrate 10. Here, the impurities 29 are selectively implanted into portions of the diffusion source layer 28 exposed to the vertically moving impurities 29, i.e., lateral portions of the diffusion source layer 28 formed on the upper surfaces of the gate patterns 18, the surface of the semiconductor substrate 10, and the surfaces of the field oxide layers 12, to a high concentration of over $10^{21}$ cm$^{-3}$. The impurities 29 are not additionally implanted into portions of the diffusion source layer 28 not exposed to the vertically moving impurity ions 29, i.e., vertical portions of the diffusion source layer 28 formed at both sidewalls of the gate patterns 28, due to a shadow effect. Also, the impurities 29 may be well-diffused compared to the impurities 22 and 26 shown in FIGS. 3 and 4.

When the impurities 29 are implanted vertically into the diffusion source layer 28, the impurity concentration of portions of the diffusion source layer 28 formed on the upper surfaces of the gate patterns 18 and the surface of the semiconductor substrate 10 is adjusted to $10^{18}$–$10^{23}$ cm$^{-3}$. This is to maintain the doping depth of shallow junction regions that will be formed later to a depth of 50 nm or less and the doping concentration of the shallow junction regions within a range of $10^{18}$–$10^{22}$ cm$^{-3}$.

When the impurities 29 are implanted vertically into the diffusion source layer 28, if the semiconductor substrate 10 is an n-type silicon substrate, the impurities 29 are B or In and if the semiconductor substrate 10 is a p-type silicon substrate, the impurities 29 are P, As, or Sb.

In particular, instead of As (or Sb) or In, a light impurity element such as P or B is selected as the impurities 29 in consideration of a subsequent process for forming highly doped source/drain regions. As a result, the diffusion depth may be deepened in a subsequent heat treatment process. Thus, the impurities 22 and 26, and 29 implanted at an angle and vertically into the diffusion source layer 28 may be the same type or different type of impurities even though they are implanted into the same type semiconductor substrate.

If the impurities 29 are implanted vertically into the diffusion source layer 28, the impurity concentration of portions 30 of the diffusion source layer 28 on the upper surfaces of the gate patterns 18, the surface of the semiconductor substrate 10, and the surfaces of the field oxide layers 12 is higher than the impurity concentration of the portions 34 of the diffusion source layer 28 at the sidewalls of the gate patterns 18. Portions 32 of the diffusion source layer 28 formed on the slanted sides of the field oxide layers 12 have a medium concentration level of impurities.

Accordingly, in FIGS. 3 through 5, the same type or different type of impurities are implanted into the diffusion source layer 20 several times in different directions. Thus, the impurity concentration of the portions 30 of the diffusion source layer 28 on the upper surfaces of the gate patterns 18 and the surface of the semiconductor substrate 10 may be higher than the impurity concentration of the portions 34 of the diffusion source layer 28 at the sidewalls of the gate patterns 18 due to the shadow effect. In other words, the portions 30 of the diffusion source layer 28 on the semiconductor substrate 10 are a high concentration diffusion source, and the portions 34 of the diffusion source layer 28 at the sidewalls of the gate patterns 18 are a low concentration diffusion source.

Moreover, the same type or different type of impurities are implanted into the diffusion source layer 20 several times in different directions. As a result, the impurity concentration of the diffusion source layer 20 is controlled to be nonuniform. Thus, the doping concentration of shallow source/drain regions composed of LDD regions and highly doped source/drain regions that will be formed later can be precisely controlled so that damage to the crystal structure of the semiconductor substrate 10 does not occur.

Figure 6:
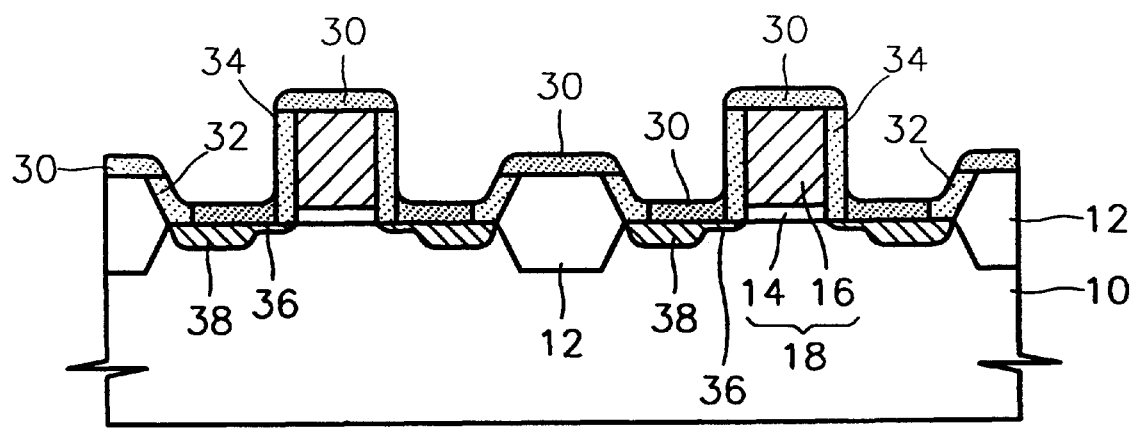

Referring to FIG. 6, the semiconductor substrate 10 on which the high concentration diffusion source and the low concentration diffusion source are formed is rapidly heat-treated to diffuse the impurities in the portions 30, 32, and 34 of the diffusion source layer 28 into the semiconductor substrate 10. As a result, shallow source/drain junction regions 36 and 38 are formed.

In other words, the impurities in the portions 30, 32, and 34 of the diffusion source layer 28 is rapidly heat-treated and diffused by a solid phase diffusion method to form the shallow source/drain junction regions 36 and 38. Thus, the shallow source/drain junction regions 36 and 38 are easily formed and the activation efficiency of the impurities is increased if the solid phase diffusion method is used.

The rapid heat-treatment represents a rapid thermal annealing (RTA), a spike annealing, or a laser annealing which is suitable for forming shallow junctions in solid phase diffusion.

In the RTA, the semiconductor substrate 10 on which the portions 30, 32, and 34 of the diffusion source layer 28 containing the impurities are formed is annealed at a temperature of 950–1150° C. for 1–1000 seconds in an inert gas atmosphere. Thus, shallow source/drain junction regions 36 and 38 having a doping depth of 50 nm or less on the semiconductor substrate 10, preferably 8–35 nm, and a doping concentration of $10^{18}$–$10^{22}$ cm$^{-3}$ may be formed.

In the spike annealing, the semiconductor substrate 10 on which the portions 30, 32, and 34 of the diffusion source layer 28 containing the impurities are formed is annealed at a temperature of 950–1200° C. in an inert gas atmosphere. Thus, the shallow source/drain junction regions 36 and 38 having a doping depth of 50 nm or less on the semiconductor substrate 10, preferably 8–35 nm, and a doping concentration of $10^{18}$–$10^{22}$ cm$^{-3}$ may be formed.

When the shallow source/drain junction regions 36 and 38 are formed by the rapid heat-treatment, there is a difference between the doping concentration of the shallow junction region 38 diffused from the high concentration diffusion source on the semiconductor substrate 10 and the doping concentration of the shallow junction region 36 diffused from the low concentration diffusion source at the sidewalls of the gate patterns 18. As a result, highly doped source/drain regions (38) are formed near the surface of the semiconductor substrate 10, and LDD regions (36) are formed near the surface of the semiconductor substrate 10 underneath the sidewalls of the gate patterns 18.

In other words, in this embodiment, the LDD regions (36) and the source/drain extension regions (36) are self-aligned near the surface of the semiconductor substrate 10 underneath the sidewalls of the gate patterns 18. The highly doped source/drain regions (38) are formed adjacent to the LDD regions (36). The process of forming the LDD regions (36) and the highly doped source/drain regions (38) by a self-alignment method is simpler than a process of forming LDD regions and highly doped source/drain regions by two-time ion implantation using conventional sidewall spacers and is beneficially utilized as a process of forming nano devices suitable for forming shallow junctions.

FIGS. 7 through 17 are cross-sections explaining a method of fabricating a MOS transistor having shallow source/drain junction regions according to a second embodiment of the present invention. In detail, the second embodiment of the present invention is the same as the first embodiment except that a method of fabricating a CMOS transistor is described.

Figure 7:
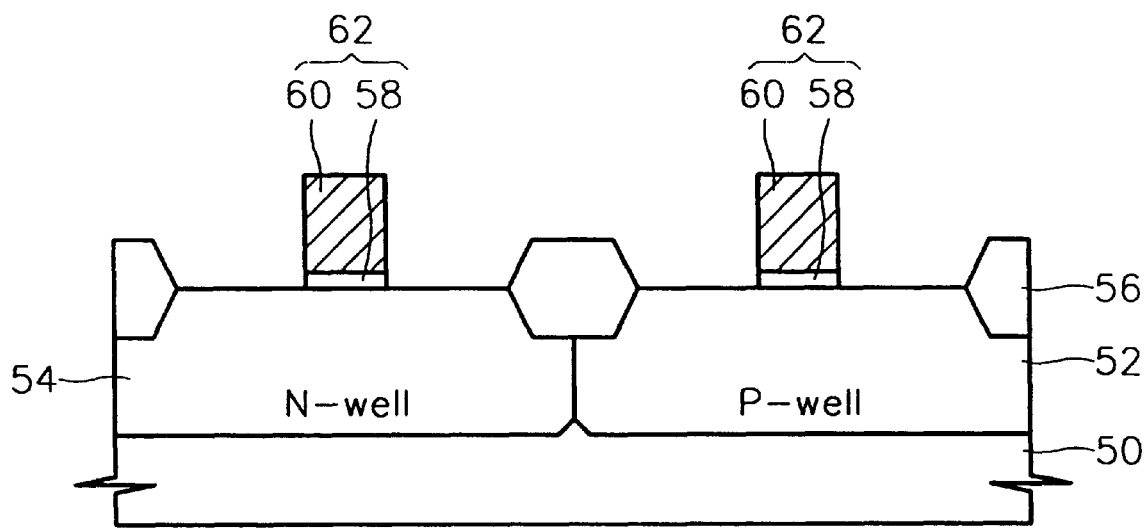
FIGS. 7 through 17 are cross-sections explaining a method of fabricating a MOS transistor having shallow source/drain junction regions according to a second embodiment of the present invention.

Referring to FIG. 7, field oxide layers 56 are formed on a semiconductor substrate 50, e.g., a p-type or n-type silicon substrate, to define an active region and an inactive region. A P-well 52 and an N-well 54 are formed on the semiconductor substrate 50 in the active region and the inactive region.

Gate patterns 62 composed of gate oxide layers 58 and gate electrodes 60 are formed on the semiconductor substrate 50 in the active region. The gate patterns 62 are formed to the same thickness and by the same method as the gate patterns 18 of FIG. 1 in the first embodiment.

Figure 8:
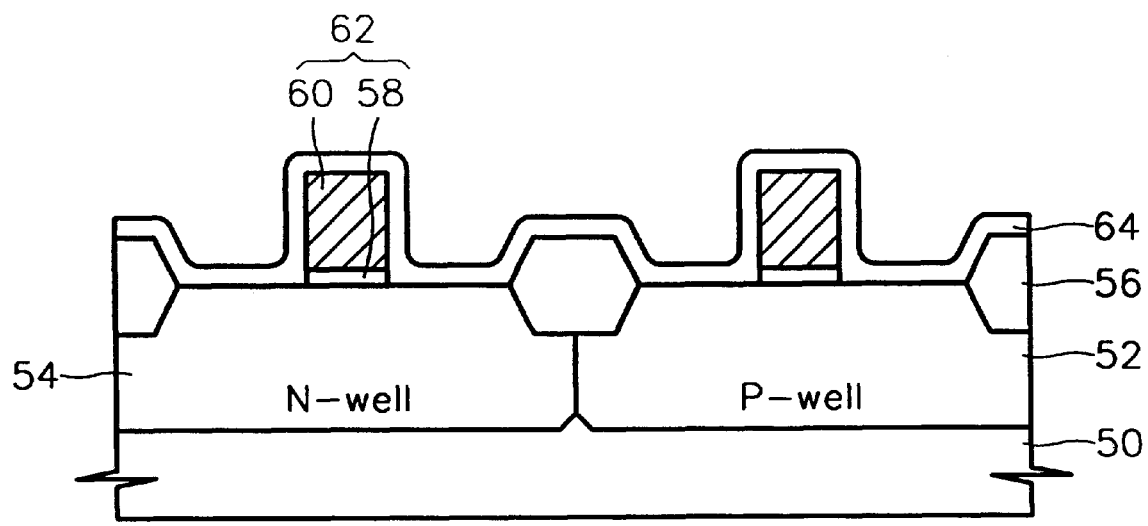

Referring to FIG. 8, a diffusion source layer 64 is formed on the entire surface of the semiconductor substrate 50. The diffusion source layer 64 is formed to a thickness of 20–400 nm. The diffusion source layer 64 serves as a buffer layer for preventing the semiconductor substrate 50 from being damaged during the implantation of impurity ions. The diffusion source layer 64 is formed by the same method as the diffusion source layer 20 of the first embodiment. The whole of the diffusion source layer 64 or a portion of the diffusion source layer 64 may be etched to be thin.

Figure 9:
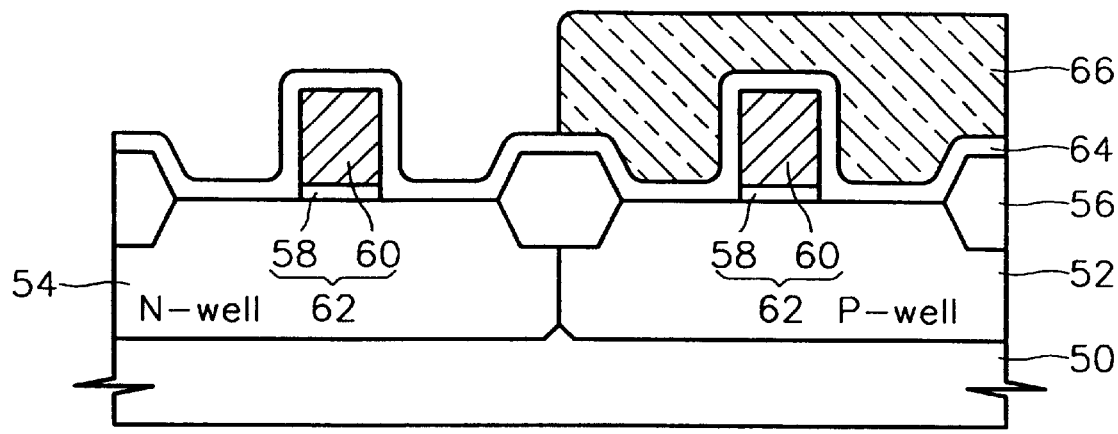

Referring to FIG. 9, a first photoresist pattern 66 is formed on a portion of the diffusion source layer 64 over the P-well 52 to open a portion of the diffusion source layer 64 over the N-well 54. In this embodiment, the portion of the diffusion source layer 64 over the N-well 54 is first opened. However, the portion of the diffusion source layer 64 over the P-well 52 may be first opened.

Figure 10:
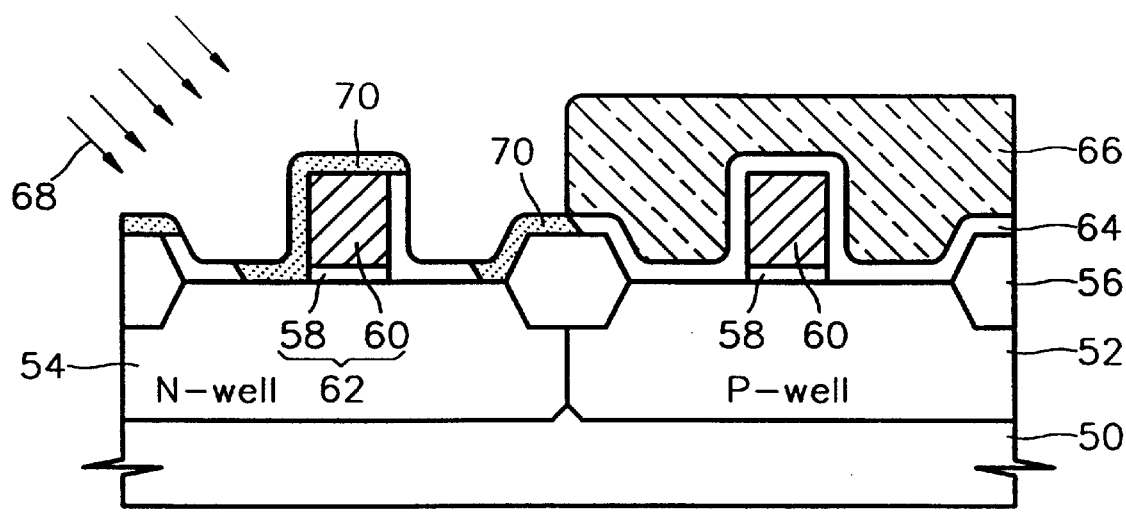
Figure 11:
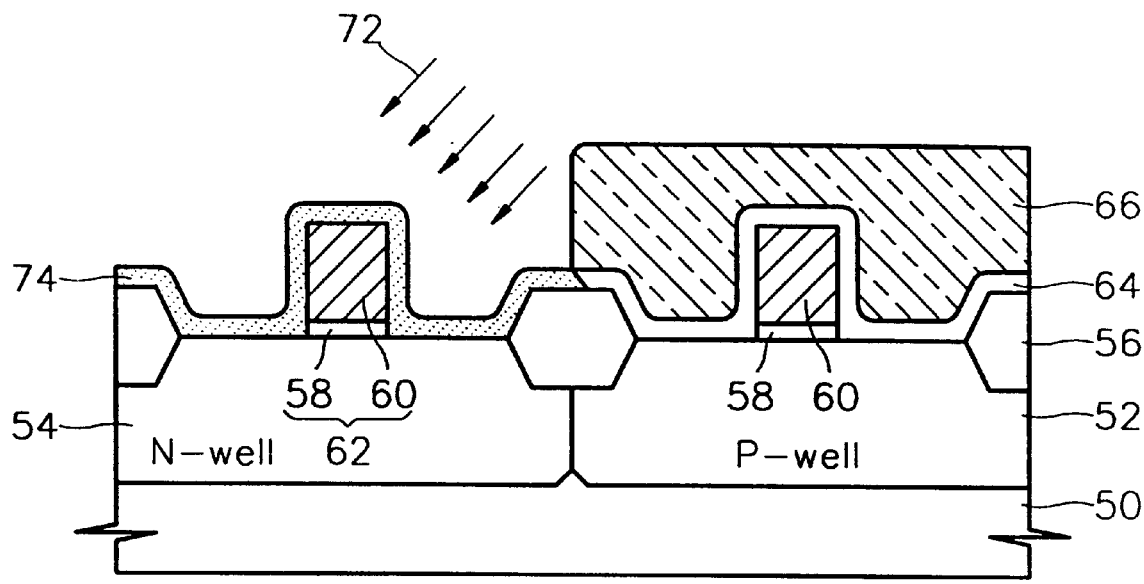

Referring to FIGS. 10 and 11, impurities 68 and 72 are implanted into the portion of the diffusion source layer 64 over the N-well 54, which are opened, at an angle. In other words, as shown with reference numeral 70 in FIG. 10, the impurities 68 are radiated at an angle from the left side of the semiconductor substrate 50 to be implanted into portions of the diffusion source layer 64 on the left sidewall and upper surface of the gate pattern 62, the surfaces of the field oxide layers 56, and the surface of the semiconductor substrate 50 over the N-well 54. In FIG. 11, the impurities 72 are radiated at an angle from the right side of the semiconductor substrate 50 to be implanted into portions of the diffusion source layer 64 on the right sidewall and upper surface of the gate pattern 62, the surfaces of the field oxide layers 56, and the surface of the semiconductor substrate 50 over the N-well 54.

As a result, a diffusion source layer 74, into which impurities are uniformly implanted, is formed. In particular, the impurity concentration of portions of the diffusion source layer 74 on both sidewalls of the gate pattern 62 is adjusted to $10^{17}$–$10^{22}$ cm$^{-3}$. The impurities 68 and 72 contained in the diffusion source layer 74 are p-type impurities, e.g., B or In.

Instead of B, a heavy impurity element such as In is selected as the impurities 68 and 72 contained in the diffusion source layer 74 in consideration of a subsequent process for forming LDD regions or source/drain extension regions. Thus, the diffusion depth may be reduced in a subsequent heat treatment process. The process of implanting the impurities 68 and 72 into the diffusion source layer 74 is the same as that of the first embodiment described with reference to FIGS. 3 and 4. Thus, its detailed description will be omitted.

Figure 12:
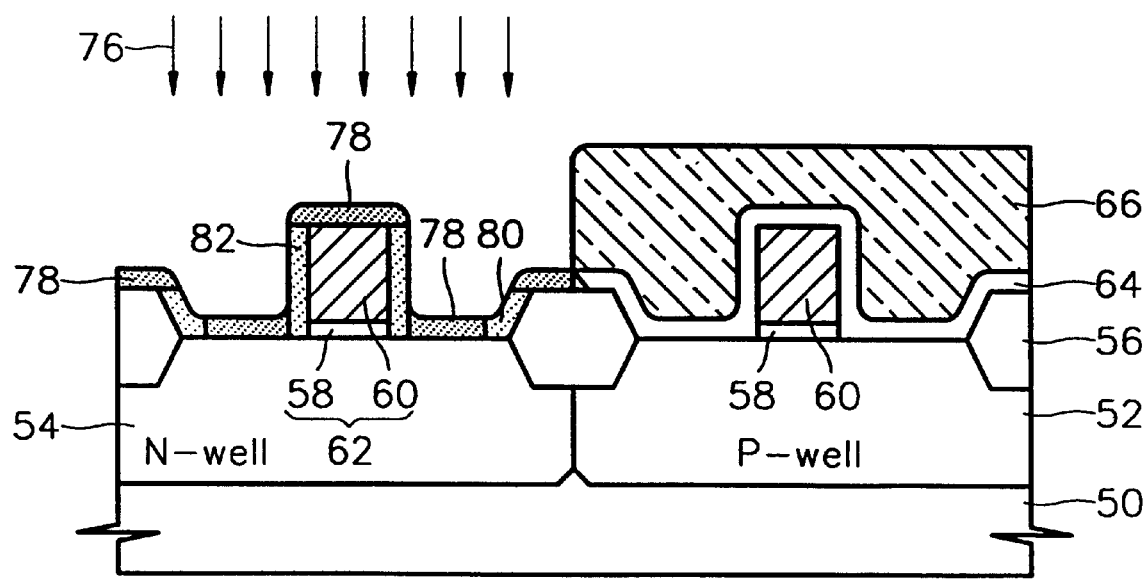

Referring to FIG. 12, the process of implanting impurities into the diffusion source layer 74 in a vertical direction, i.e., perpendicular to the semiconductor substrate 50 is the same as that of the first embodiment described with reference to FIG. 5. In detail, impurities 76 are implanted vertically into the portion of the diffusion source layer 74 over the N-well 54. In other words, p-type impurities, e.g., B or In, are implanted into the portion of the diffusion source layer 74 over the N-well 54. Here, the impurities 76 are selectively implanted into the portions of the diffusion source layer 74 over the N-well 54 exposed to the vertically moving impurities 76, i.e., lateral portions of the diffusion source layer 74 on the upper surface of the gate pattern 62, the surface of the semiconductor substrate 50, the surfaces of the field oxide layers 56, to a high concentration of over $10^{21}$ cm$^{-3}$. The impurities 76 are not additionally implanted into portions of the diffusion source layer 74 over the N-well 54 not exposed to the vertically moving impurities 76, i.e., vertical portions of the diffusion source layer 74 at both sidewalls of the gate pattern 62 over the N-well, due to a shadow effect.

When the impurities 76 are implanted vertically into the portion of the diffusion source layer 74 over the N-well 54, instead of In, a light impurity element such as B is selected as the impurities 76 in consideration of a subsequent process for forming highly doped source/drain regions. Thus, the diffusion depth may be deepened in a subsequent heat treatment process. As a result, the same type or different type of impurities may be implanted at an angle and vertically into the portion of the diffusion source layer 74 over the N-well 54.

When the impurities 76 are implanted vertically into the diffusion source layer 74 over the N-well 54, the impurity concentration of the portions of the diffusion source layer 74 on the upper surface of the gate pattern 62 and the surface of the semiconductor substrate 50 is adjusted to $10^{18}$–$10^{23}$ cm$^{-3}$. This is to maintain the doping depth of shallow source/drain junction regions that will be formed later to a depth of 50 nm or less and the doping concentration of the shallow source/drain junction regions within a range of $10^{18}$–$10^{22}$ cm$^{-3}$.

If the impurities 76 are implanted vertically into the portion of the diffusion source layer 74 over the N-well 54, the impurity concentration of portions 78 of the diffusion source layer 74 on the upper surface of the gate pattern 62, the surface of the semiconductor substrate 50, and the surfaces of the field oxide layers 56 is higher than the impurity concentration of portions 82 of the diffusion source layer 74 at both sidewalls of the gate pattern 62. The impurity concentration of portions 80 of the diffusion source layer 74 on the slanted sides of the field oxide layers 56 has a medium concentration level of impurities. Also, the impurities 76 may be well-diffused compared to the impurities 68 and 72 described with reference to FIGS. 10 and 11.

Accordingly, in FIGS. 10 through 12, the same type or different type of impurities are implanted into the portion of the diffusion source layer 64 over the N-well 54 several times in different directions. Thus, the impurity concentration of the portions 78 of the diffusion source layer 74 on the upper surface of the gate pattern 62 and the surface of the semiconductor substrate 50 may be higher than the impurity concentration of the portions 82 of the diffusion source layer 74 at both sidewalls of the gate pattern 62 due to the shadow effect. In other words, the portions 78 of the diffusion source layer 74 on the semiconductor substrate 50 are a high concentration diffusion source, and the portions 82 of the diffusion source layer 74 at both sidewalls of the gate pattern 62 are a low concentration diffusion source.

Moreover, the impurity concentration of the diffusion source layer 64 is controlled to be nonuniform. Thus, the doping concentration of shallow source/drain regions composed of LDD regions and highly doped source/drain regions that will be formed later can be precisely controlled so that damage to the crystal structure of the semiconductor substrate 50 does not occur.

Figure 13:
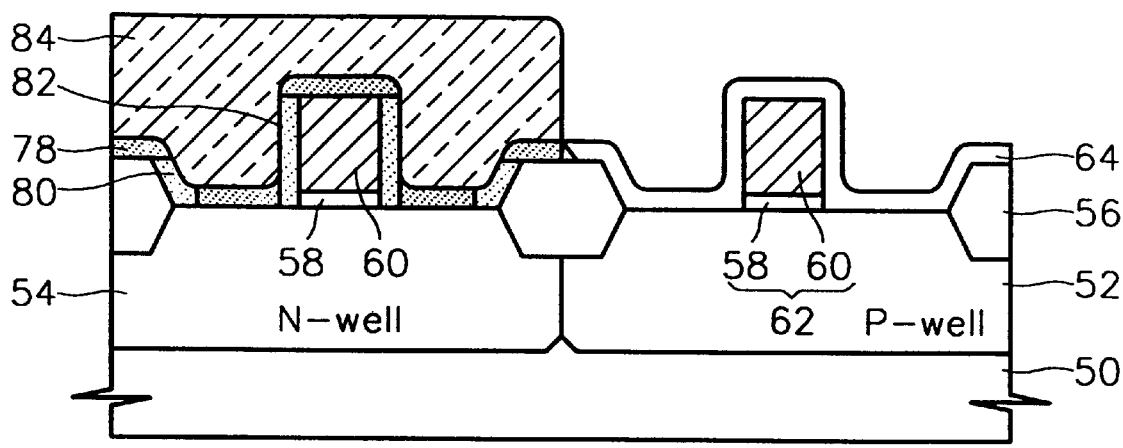

Referring to FIG. 13, the first photoresist pattern 66 over the P-well 52 is removed. Next, a second photoresist pattern 84 is formed on the portion of the diffusion source layer 64 over the N-well 54 to open the portion of the diffusion source layer 64 over the P-well 52.

Figure 14:
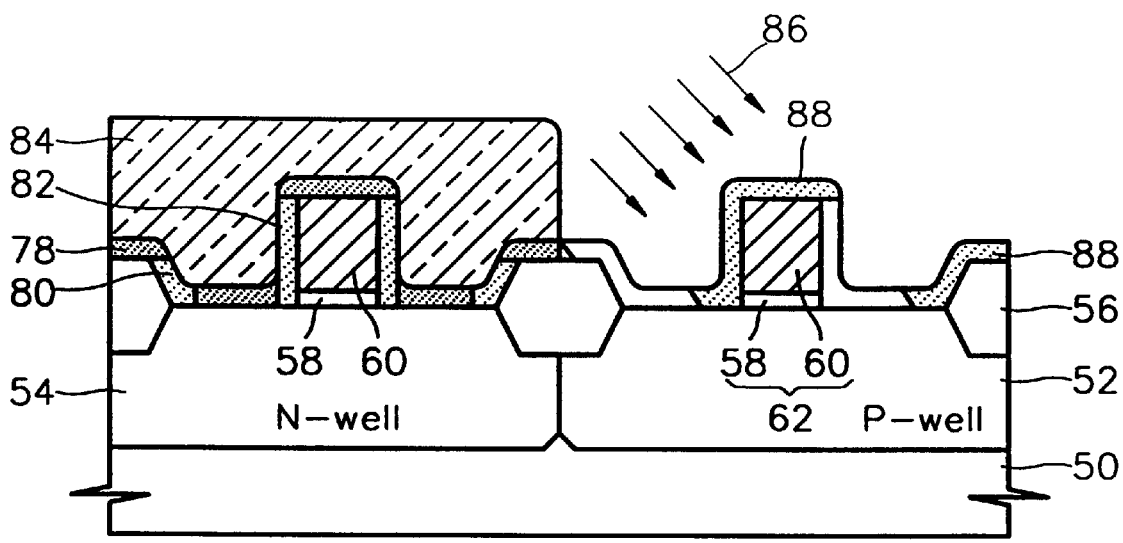
Figure 15:
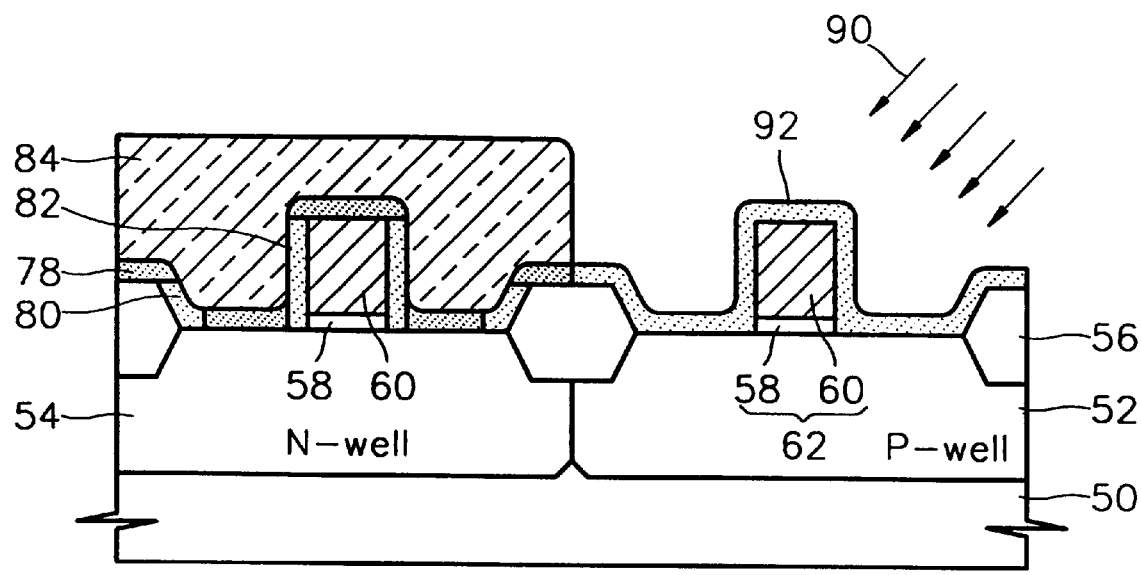

Referring to FIGS. 14 and 15, an ion implantation process described with reference to FIGS. 14 and 15 is the same as the ion implantation process described with reference to FIGS. 10 and 11. In other words, impurities 86 and 90 are implanted into the portion of the diffusion source layer 64 over the P-well 52, which is opened, at an angle. Here, n-type impurities, e.g., P, As, or SB, are implanted into the portion of the diffusion source layer 64 over the P-well 52 which is opened. In particular, instead of P, a heavy impurity element such as As or Sb is selected as the impurities 86 and 90 contained in the diffusion source layer 64 in consideration of a process for forming LDD regions and source/drain extension regions. Thus, the diffusion depth may be reduced in a subsequent heat treatment process.

In detail, as shown with reference numeral 88 in FIG. 14, the impurities 86 are radiated at an angle from the left side of the semiconductor substrate 50 to be implanted into portions of the diffusion source layer 64 on the left sidewall and upper surface of the gate pattern 62, the surfaces of the field oxide layers 56, and the surface of the semiconductor substrate 10. In FIG. 15, the impurities 90 are radiated at an angle from the right side of the semiconductor substrate 50 to be implanted into portions of the diffusion source layer 64 on the right sidewall and upper surface of the gate pattern 62, the surfaces of the field oxide layers 56, and the surface of the semiconductor substrate 50.

As a result, a diffusion source layer 92, into which impurities are uniformly implanted, is formed. In particular, the impurity concentration of portions of the diffusion source layer 92 at both sidewalls of the gate pattern 62 is adjusted to $10^{17}$–$10^{22}$ cm$^{-3}$.

Figure 16:
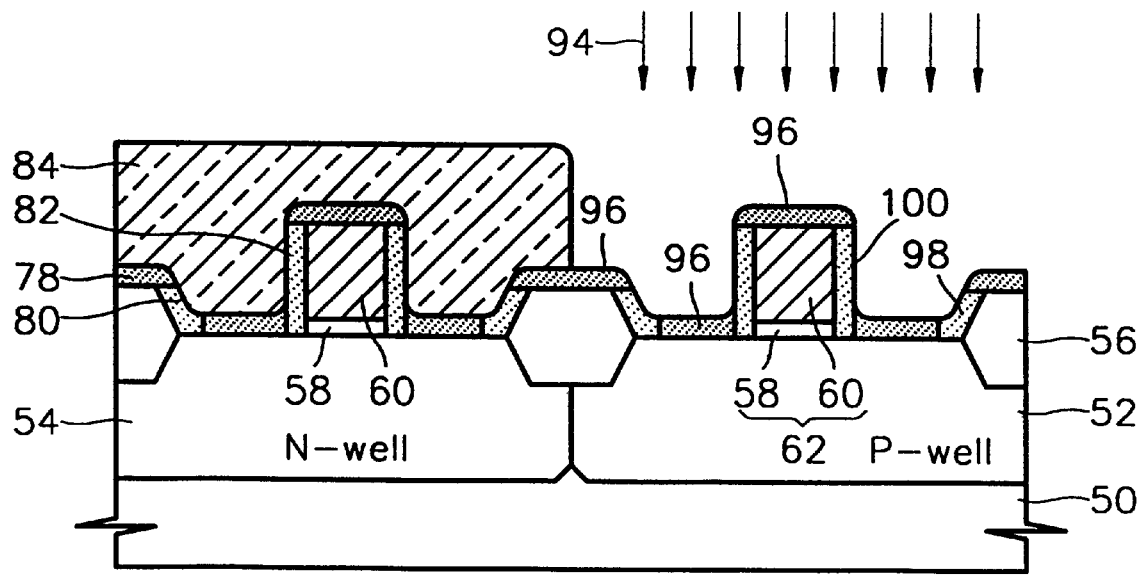

Referring to FIG. 16, an ion implantation process described with reference to FIG. 16 is the same as the ion implantation process described with reference to FIG. 12 except that n-type impurities, e.g., P, As, or Sb, are implanted into the P-well 52.

In detail, impurities 94 are radiated into the diffusion source layer 92 over the P-well 52 in a vertical direction, i.e., perpendicular to the semiconductor substrate 50. Here, the impurities 94 are selectively implanted into portions of the diffusion source layer 92 over the P-well 52 exposed to the vertically moving impurities 94, i.e., lateral portions of the diffusion source layer 92 formed on the upper surface of the gate pattern 62, the surface of the semiconductor substrate 50, and the surfaces of the field oxide layers 56, to a high concentration of over $10^{21}$ cm$^{-3}$. The impurities 94 are not additionally implanted into portions of the diffusion source layer 92 over the P-well 52 not exposed to the vertically moving impurity ions 94, i.e., vertical portions of the diffusion source layer 92 formed at both sidewalls of the gate pattern 62, due to a shadow effect.

When the impurities 94 are implanted vertically into the diffusion source layer 92 over the P-well 52, instead of Sb or As, a light impurity element such as P is selected as the impurities 94 in consideration of a subsequent process for forming highly doped source/drain regions. Thus, the diffusion depth may be deepened in a subsequent heat treatment process. As a result, the same type or different type of impurities may be implanted at an angle and vertically into the diffusion source layer 64 over the P-well 52.

When the impurities 94 are implanted vertically into the diffusion source layer 92 over the P-well 52, the impurity concentration of the portions of the diffusion source layer 92 on the upper surface of the gate pattern 62 and the surface of the semiconductor substrate 50 is adjusted to $10^{18}$–$10^{23}$ cm$^{-3}$. This is to maintain the doping depth of shallow source/drain junction regions that will be formed later to a depth of 50 nm or less and the doping concentration of the shallow source/drain junction regions within a range of $10^{18}$–$10^{22}$ cm$^{-3}$.

If the impurities 94 are implanted vertically into the diffusion source layer 92 over the P-well 52, the impurity concentration of portions 96 of the diffusion source layer 92 on the upper surface of the gate pattern 62, the surface of the semiconductor substrate 50, and the surfaces of the field oxide layers 56 is higher than the impurity concentration of portions 100 of the diffusion source layer 92 at both sidewalls of the gat pattern 62. The impurity concentration of portions 98 of the diffusion source layer 92 on the slanted sides of the field oxide layers 56 has a medium concentration level of impurities. Also, the impurities 94 may be well-diffused compared to the impurities 86 and 90 described with reference to FIGS. 14 and 15.

Accordingly, in FIGS. 14 through 16, the same type or different type of impurities are implanted into the diffusion source layer 64 over the P-well 52 several times in different directions. Thus, the impurity concentration of the portions 96 of the diffusion source layer 92 on the upper surface of the gate pattern 62 and the surface of the semiconductor substrate 50 may be higher than the impurity concentration of the portions 100 of the diffusion source layer 92 at the sidewalls of the gate pattern 62 due to the shadow effect. In other words, the portions 96 of the diffusion source layer 92 on the semiconductor substrate 50 are a high concentration diffusion source, and the portions 100 of the diffusion source layer 92 at the sidewalls of the gate pattern 62 are a low concentration diffusion source.

Moreover, the same type or different type of impurities are implanted into the diffusion source layer 64 over the P-well 52 several times in different directions. As a result, the impurity concentration of the diffusion source layer 92 is controlled to be nonuniform. Thus, the doping concentration of shallow source/drain junction regions composed of LDD regions and highly doped source/drain regions that will be formed later can be precisely controlled so that damage to the crystal structure of the semiconductor substrate 50 does not occur.

Figure 17:
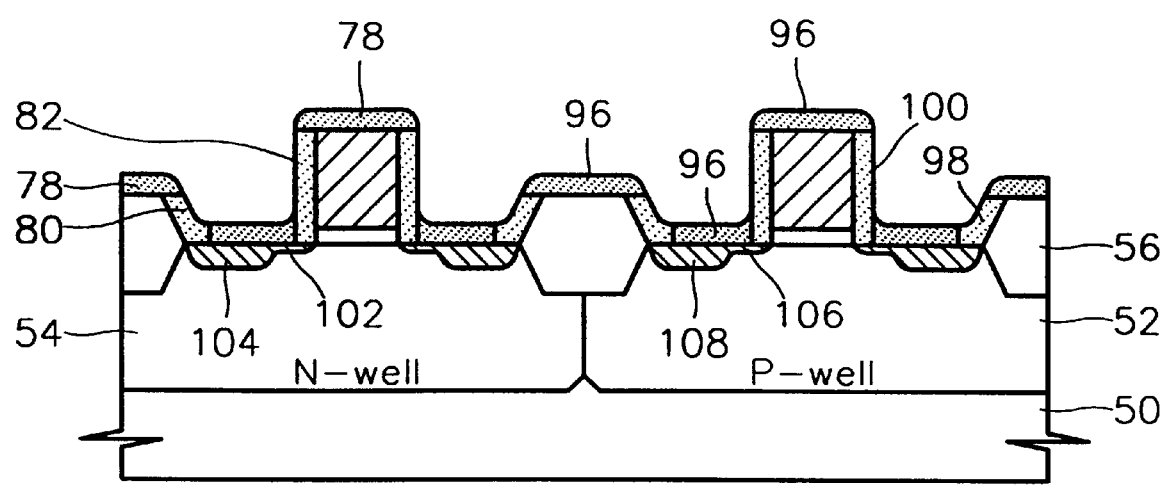

Referring to FIG. 17, the second photoresist pattern 84 over the N-well 54 is removed. Next, the semiconductor substrate 50 on which the portions 78, 80, 82, 96, 98, and 100 of the diffusion source layer 64 containing the impurities are formed is rapidly heat-treated to diffuse the impurities in the portions 78, 80, 82, 96, 98, and 100 of the diffusion source layer 64 into the semiconductor substrate 50. As a result, shallow source/drain junction regions 102, 104, 106 and 108 are formed.

In other words, the impurities in the portions 78, 80, and 82 of the diffusion source layer 74 over the N-well 54 is rapidly heat-treated and diffused by a solid phase diffusion method to form the shallow source/drain junction regions 102 and 104. The impurities in the portions 96, 98, and 100 of the diffusion source layer 92 over the P-well 52 is rapidly heat-treated and diffused by a solid phase diffusion method to form the shallow source/drain junction regions 106 and 108. Thus, the shallow source/drain junction regions 102, 104, 106, and 108 are easily formed and the activation efficiency of the impurities is increased if the solid phase diffusion method is used.

The rapid heat-treatment represents a RTA, a spike annealing, or a laser annealing which is suitable for forming shallow junctions in solid phase diffusion.

In the RTA, the semiconductor substrate 50 on which the portions 78, 80, 82, 96, 98, and 10 of the diffusion source layer 64 containing impurities are formed is annealed at a temperature of 950–1150° C. for 1–1000 seconds in an inert gas atmosphere. Thus, shallow source/drain junction regions 102, 104, 106, and 108 having a doping depth of 50 nm or less on the semiconductor substrate 50, preferably 8–35 nm, and a doping concentration of $10^{18}$–$10^{22}$ cm$^{-3}$ may be formed.

In the spike annealing, the semiconductor substrate 50 on which the portions 78, 80, 82, 96, 98, and 10 of the diffusion source layer 64 containing impurities are formed is annealed at a temperature of 950–1200° C. in an inert gas atmosphere. Thus, the shallow source/drain junction regions 102, 104, 106, and 108 having a doping depth of 50 nm or less on the semiconductor substrate 50, preferably 8–35 nm, and a doping concentration of $10^{18}$–$10^{22}$ cm$^{-3}$ may be formed.

When the shallow source/drain junction regions 102, 104, 106, and 108 are formed by the rapid heat-treatment, there is a difference between the doping concentration of the shallow junction regions 104 and 108 diffused from the portions 78 and 96 of the diffusion source layer 64 having a high concentration on the semiconductor substrate 50 and the doping concentration of the shallow junction regions 102 and 106 diffused from the portions 82 and 100 of the diffusion source layer 64 having a low concentration at the sidewalls of the gate patterns 62.

As a result, LDD regions (102 and 106) and source/drain extension regions (102 and 106) are self-aligned near the surface of the semiconductor substrate 50 underneath both sidewalls of the gate patterns 62. Highly doped source/drain regions (104 and 108) are formed adjacent to the LDD regions (102 and 106).

The process of forming the LDD regions (102 and 106) and the highly doped source/drain regions (104 and 108) by a self-alignment method is simpler than a process of forming LDD regions and highly doped source/drain regions by two-time ion implantation using conventional sidewall spacers and is beneficially utilized as a process of forming nano devices suitable for forming shallow junctions.

Moreover, in this embodiment, the portions 78, 80, and 82 of the diffusion source layer 64 over the N-well 54 and the portions 96, 98, and 100 of the diffusion source layer 64 over the P-well 52 are formed, and then are rapidly heat-treated. As a result, the LDD regions (102 and 106) and the highly doped source/drain regions (104 and 108) are formed by a self-alignment method.

However, as shown in FIG. 12, the portions 78, 80, and 82 of the diffusion source layer 64 may be formed over the N-well 54, and then rapidly heat-treated to self-align the LDD region (102) and the highly doped source/drain region 104. Next, as shown in FIG. 16, the portions 96, 98, and 100 of the diffusion source layer 64 may be formed over the P-well 52, and then rapidly heat-treated to self-align the LDD region (106) and the highly doped source/drain region (108).

As described above, according to the present invention, a diffusion source layer is formed on a semiconductor substrate on which gate patterns are formed. Next, the same type or different type of impurities are implanted into the diffusion source layer several times in different directions. As a result, dislocation does not occur and the impurity concentration of the diffusion source layer can be nonuniformly controlled so that damage to the crystal structure of the semiconductor substrate does not occur.

Moreover, impurities contained in the diffusion source layer having a nonuniform impurity concentration are diffused into the semiconductor substrate by a solid phase diffusion method. Thus, shallow source/drain junction regions composed of LDD regions and highly doped source/drain regions are formed near the surface of the semiconductor substrate underneath the sidewalls of the gate patterns by a self-alignment method.

What is claimed is:

1. A method of fabricating a MOS transistor comprising:
   forming gate patterns on a semiconductor substrate;
   forming a diffusion source layer on the entire surface of the semiconductor substrate;
   implanting the same type or different type of impurities into the diffusion source layer according to a plurality of implantation angles relative to the semiconductor substrate so that the impurity concentration of portions of the diffusion source layer on upper surfaces of the gate patterns and the semiconductor substrate is higher than the impurity concentration of portions of the diffusion source layer on sidewalls of the gate patterns due to a shadow effect; and
   diffusing impurities contained in the diffusion source layer into the semiconductor substrate by a solid phase diffusion method to form shallow source/drain junction regions having LDD regions underneath the sidewalls of the gate patterns and highly doped source/drain regions by a self-alignment method.

2. The method of claim 1, wherein the diffusion source layer is an USG layer or a silicon oxide layer.

3. The method of claim 2, wherein the USG layer is formed by spin-coating and densifying a liquid silicate glass.

4. The method of claim 3, wherein the liquid silicate glass is densified at a temperature of 200–600° C. for 2–30 minutes.

5. The method of claim 1, wherein the silicon oxide layer is formed by one of CVD and PECVD using a compound gas containing $SiH_4$ and $O_2$, dry oxidation, and wet oxidation.

6. The method of claim 1, wherein the diffusion source layer is formed to a thickness of 20–400 nm.

7. The method of claim 1, wherein the whole of the diffusion source layer or a portion of the diffusion source layer isetched to be thin.

8. The method of claim 1, wherein the implantation of the impurities into the diffusion source layer is performed using one of a general ion implanter and a plasma ion implanter including a Pill and an ISI.

9. The method of claim 1, wherein the impurities are implanted into the diffusion source layer at an angle from the semiconductor substrate to adjust the impurity concentration of the portions of the diffusion source layer on the sidewalls of the gate patterns to $10^{17}$–$10^{22}$ cm$^{-3}$.

10. The method of claim 1, wherein the impurities are implanted vertically into the diffusion source layer to adjust the impurity concentration of the portions of the diffusion source layer on the upper surfaces of the gate patterns and the semiconductor substrate to $10^{18}$–$10^{22}$ cm$^{-3}$.

11. The method of claim 1, wherein the impurities implanted into a portion of the diffusion source layer over a P-well are one of P, As, and Sb, which are n-type impurities even though the semiconductor substrate is a p-type silicon substrate, and the impurities implanted into a portion of the diffusion source layer over an N-well are one of B and In, which are p-type impurities even though the semiconductor substrate is an n-type silicon substrate.

12. The method of claim 1, wherein one of light B and light P of p-type and n-type impurities is implanted into the portions of the diffusion source layer on the upper surfaces of the gate patterns and the semiconductor substrate, and one of heavy In, heavy As, and heavy Sb of p-type and n-type impurities is implanted into the portions of the diffusion source layer at the sidewalls of the gate patterns.

13. The method of claim 1, wherein forming the shallow source/drain junction regions by the solid phase diffusion method is performed using one of RTA, spike annealing, and laser annealing.

14. The method of claim 13, wherein in the RTA, the semiconductor substrate on which the diffusion source layer containing the impurities is formed is annealed at a temperature of 950–1150° C. for 1–1000 seconds in an inert gas atmosphere.

15. The method of claim 13, wherein in the spike annealing, the semiconductor substrate on which the diffusion source layer containing the impurities is formed is annealed at a temperature of 950–1200° C. in an inert gas atmosphere.

16. The method of claim 1, wherein the shallow source/drain junction regions have a doping depth of 50 nm or less on the semiconductor substrate and a doping concentration $10^{18}$–$10^{22}$ cm$^{-3}$.

17. A method of fabricating a MOS transistor comprising:

forming gate patterns on a semiconductor substrate in which a P-well and an N-well are formed;

forming a diffusion source layer on the entire surface of the semiconductor substrate;

forming a photoresist pattern on the diffusion source layer to open the N-well or the P-well;

implanting the same type or different type of impurities first into a portion of the diffusion source layer over the N-well and then into a portion of the diffusion source layer over the P-well, or first into the portion of the diffusion source layer over the P-well and then into the portion of the diffusion source layer over the N-well, according to a plurality of implantation angles relative to the semiconductor substrate so that the impurity concentration of portions of the diffusion source layer on upper surfaces of the gate patterns and the semiconductor substrate is higher than the impurity concentration of portions of the diffusion source layer at sidewalls of the gate patterns due to a shadow effect;

removing the photoresist pattern; and diffusing impurities contained in the portions of the diffusion source layer over the N-well and the P-well into the semiconductor substrate by a solid phase diffusion method to form shallow source/drain junction regions having LDD regions underneath the sidewalls of the gate patterns and highly doped source/drain regions by a self-alignment method.

18. The method of claim 17, wherein the diffusion source layer is an USG layer or a silicon oxide layer.

19. The method of claim 17, wherein the diffusion source layer is formed to a thickness of 20–400 nm.

20. The method of claim 17, wherein the whole of the diffusion source layer or a portion of the diffusion source layer is etched to be thin.

21. The method of claim 17, wherein the implantation of the impurities into the diffusion source layer is performed using one of a general ion implanter and a plasma ion implanter including a PIII and an ISI.

22. The method of claim 17, wherein the impurities are implanted into the diffusion source layer at an angle from the semiconductor substrate to adjust the impurity concentration of the portions of the diffusion source layer at the sidewalls of the gate patterns to $10^{17}$–$10^{22}$ cm$^{-3}$.

23. The method of claim 17, wherein the impurities are implanted vertically into the diffusion source layer to adjust the impurity concentration of the portions of the diffusion source layer on the upper surfaces of the gate patterns and the semiconductor substrate to $10^{18}$–$10^{22}$ cm$^{-3}$.

24. The method of claim 17, wherein the impurities implanted into a portion of the diffusion source layer over the P-well are one of P, As, and Sb, which are n-type impurities even though the semiconductor substrate is a p-type silicon substrate, and the impurities implanted into a portion of the diffusion source layer over the N-well are one of B and In, which are is p-type impurities even though the semiconductor substrate is an n-type silicon substrate.

25. The method of claim 17, wherein one of light B and light P of p-type and n-type impurities is implanted into the portions of the diffusion source layer on the upper surfaces of the gate patterns and the semiconductor substrate, and one of heavy In, heavy As, and heavy Sb of p-type and n-type impurities is implanted into the portions of the diffusion source layer at the sidewalls of the gate patterns.

26. The method of claim 17, wherein forming the shallow source/drain junction regions by the solid phase diffusion method is performed using one of RTA, spike annealing, and laser annealing.

27. The method of claim 17, wherein the shallow source/drain junction regions have a doping depth of 50 nm or less on the semiconductor substrate and a doping concentration $10^{18}$–$10^{22}$ cm$^{-3}$.

28. The method of claim 17, wherein impurities are implanted into the portion of the diffusion source layer over the N-well or the P-well, the photoresist pattern is removed, and the impurities contained in the portion of the diffusion source layer are diffused into the semiconductor substrate to form shallow source/drain junction regions.

* * * * *